(12) United States Patent
Tian et al.

(10) Patent No.: US 12,174,277 B1
(45) Date of Patent: Dec. 24, 2024

(54) MAGNETIC PARTICLE IMAGING DEVICE BASED ON PARALLEL SCANNING OF MULTIPLE MAGNETIC FIELD FREE LINES

(71) Applicant: Beihang University, Beijing (CN)

(72) Inventors: Jie Tian, Beijing (CN); Siao Lei, Beijing (CN); Yu An, Beijing (CN)

(73) Assignee: Beihang University, Beijing (CN)

( * ) Notice: Subject to any disclaimer, the term of this patent is extended or adjusted under 35 U.S.C. 154(b) by 0 days.

(21) Appl. No.: 18/780,524

(22) Filed: Jul. 23, 2024

(30) Foreign Application Priority Data

Jan. 31, 2024 (CN) .......................... 202410130901.6

(51) Int. Cl.
*G01R 33/12* (2006.01)

(52) U.S. Cl.
CPC ............................... *G01R 33/1276* (2013.01)

(58) Field of Classification Search
CPC ................. G01R 33/00; G01R 33/0035; G01R 33/0023; G01R 33/0017; G01R 31/3191; G01R 33/0358; G01R 33/0356; G01R 33/3852; G01R 33/1276; G01R 33/383; G01B 7/004; G01C 17/38; G06F 3/017; G06F 3/0346; G06F 3/012; H01L 39/223
See application file for complete search history.

(56) References Cited

U.S. PATENT DOCUMENTS

| | | | |
|---|---|---|---|
| 2017/0067972 A1* | 3/2017 | Diamond | G01R 33/1276 |
| 2018/0231629 A1* | 8/2018 | Top | G01R 33/1276 |
| 2023/0099731 A1 | 3/2023 | Yamauchi et al. | |

FOREIGN PATENT DOCUMENTS

| | | | | |
|---|---|---|---|---|
| CN | 113288106 A | 8/2021 | | |
| CN | 115153490 A | 10/2022 | | |
| CN | 115191982 A | 10/2022 | | |
| CN | 115886773 A | 4/2023 | | |
| CN | 116626563 A | 8/2023 | | |
| CN | 117078792 A | 11/2023 | | |
| CN | 117100244 A | 11/2023 | | |
| DE | 102019216041 A1 | 4/2021 | | |
| WO | WO-2022019835 A1 * | 1/2022 | ........... | A61B 5/0035 |

(Continued)

OTHER PUBLICATIONS

Patrick Vogel, et al., Parallel magnetic particle imaging, Review of Scientific Instruments, 2020, pp. 1-9, vol. 91.

(Continued)

*Primary Examiner* — Jermele M Hollington
*Assistant Examiner* — Taqi R Nasir
(74) *Attorney, Agent, or Firm* — Bayramoglu Law Offices LLC

(57) ABSTRACT

An MPI device based on parallel scanning of multiple magnetic field free lines (FFLs) is provided. The MPI device includes a first coil, a second coil, an excitation coil, and a receiving coil; the first coil is configured to receive a first-frequency current and generate a plurality of FFLs; the second coil is configured to receive the first-frequency current and drive the FFLs to rotate under a joint action with the first coil; the excitation coil is configured to receive a second-frequency current and drive the FFLs to scan fast; the receiving coil receives a particle signal scanned by the FFLs at each time point; and the first coil, the second coil, the excitation coil and the receiving coil are provided in longitudinal symmetry along the center of the imaging field of view.

8 Claims, 3 Drawing Sheets

(56) References Cited

FOREIGN PATENT DOCUMENTS

| WO | 2023042265 A1 | 3/2023 |
| WO | 2023062810 A1 | 4/2023 |
| WO | 2023170859 A1 | 9/2023 |

OTHER PUBLICATIONS

Zu Wanni, et al., Electronically Rotated Field-Free Line Generation for Open Bore Magnetic Particle Tomography Imaging, Transactions of China Electrotechnical Society, 2020, pp. 4161-4170, vol. 35 No. 19.

Zhang Taiyang, Implementation and Optimization of Magnetic Particle Imaging System, Shengyang University of Technology, 2023, pp. 1-70.

* cited by examiner

MAGNETIC PARTICLE IMAGING DEVICE BASED ON PARALLEL SCANNING OF MULTIPLE MAGNETIC FIELD FREE LINES

CROSS-REFERENCE TO THE RELATED APPLICATIONS

This application is based upon and claims priority to Chinese Patent Application No. 202410130901.6, filed on Jan. 31, 2024, the entire contents of which are incorporated herein by reference.

TECHNICAL FIELD

The present invention belongs to the field of magnetic particle imaging (MPI), particularly to an MPI device based on parallel scanning of multiple magnetic field free lines (FFLs).

BACKGROUND

MPI is a kind of emerging imaging technology, which has the advantages of quantization and ultra-high sensitivity. Currently, MPI is widely used in many fields, including tumor detection, cardiovascular imaging, atherosclerosis imaging, cell tracking, and magnetic hyperthermia guidance. The main obstacle from preclinical to clinical application, and the application of MPI on human scale, is the lack of the imaging equipment with sufficient aperture. At present, only MPI devices for small-scale animals are available on the market, and MPI devices with large aperture that are suitable for the human body are being researched and developed.

For the R&D of equipment with large aperture, it is an optional technical solution to add a slow-moving drive field on the basis of the gradient field, so as to achieve large-range scanning by the large-range movement of the field free region (FFR). However, a significant drawback of the above method is that it takes a long time to scan and the limitation of peripheral nerve stimulation (PNS). Long-time scanning brings a series of hazards, which requires high equipment stability and increases the total energy consumption of the equipment. Additionally, in terms of some scenes that require high time resolution, such as the changes of heartbeat and blood flow, it may not be able to get enough effective information by the imaging with long time. Especially for the devices with large aperture that could be applied to large-scale animals and human, it is more essential to maintain a large-range scanning while having a high time resolution during these application scenes.

As early as 2018, a large aperture MPI device based on a focusing field has been proposed. Presently, the construction directions of large aperture MPI equipment can be divided into two types: to add a focusing field additionally, where the scanning range is increased by a large-range movement; and to reduce the gradient of the gradient field, where the large-range scanning of the FFR is achieved under the same excitation amplitude. However, the former needs extra power supply and has a large energy consumption, while the latter is not ideal in terms of resolution, both of which are unable to generate images with a large field of view in a short period of time.

The FFR obtained by the MPI equipment mainly includes field free line (FFL) and field free point (FFP). FFL-based devices have a better signal-to-noise ratio since they can excite particles to generate signals in more regions. Therefore, the present invention provides an MPI device based on parallel scanning of multiple FFLs, which can scan a plurality of regions in parallel and realize large-range imaging. In addition, one small region is scanned through one FFL, and the image scanned with a large field of view can be obtained by stitching together images of multiple small regions, such that the image with a large field of view can be obtained without increasing PNS.

Based on the above, the present invention provides an MPI device based on parallel scanning of multiple FFLs.

SUMMARY

To solve the above problems in prior art, that is, the limitation of PNS and specific absorption rate (SAR) as well as the low imaging time resolution during the sufficient-range large aperture scanning, the present invention provides an MPI device based on parallel scanning of multiple FFLs. The device includes a first coil, a second coil, an excitation coil, and a receiving coil.

The first coil is configured to receive a first-frequency current and generate a plurality of FFLs. N first coils are uniformly provided along a plane where the N first coils are located.

The second coil is configured to receive the first-frequency current and drive the FFLs to rotate under a joint action with the first coil. 2×(N−1) second coils are uniformly provided along a plane where the 2×(N−1) second coils are located, and the second coil is provided on a side, away from the first coil, of an imaging field of view.

The excitation coil is configured to receive a second-frequency current and drive the FFLs to scan fast. N−1 excitation coils are uniformly provided along a plane where the N−1 excitation coils are located. The excitation coil is provided on a side, adjacent to the imaging field of view, of the first coil.

The receiving coil receives a particle signal scanned by the FFLs at each time point, and N−1 receiving coils are uniformly provided along a plane where the N−1 receiving coils are located. The receiving coil is provided on a side, adjacent to the imaging field of view, of the excitation coil.

The first coil, the second coil, the excitation coil and the receiving coil are provided in longitudinal symmetry along a center of the imaging field of view.

In some preferred embodiments, a long axis of the first coil is perpendicular to a long axis of the second coil.

In some preferred embodiments, the 2×(N−1) second coils are uniformly provided along the plane where the 2×(N−1) second coils are located, which are specifically as follows:

two columns of second coils are provided on a plane, away from the first coil, of the imaging field of view, and N−1 groups are provided in each column.

In some preferred embodiments, straight lines where long axes of the N−1 second coils in one column are located coincide with each other, and the straight lines where the long axes of the N−1 second coils in different columns are located are parallel with each other.

In some preferred embodiments, a second frequency is greater than a first frequency.

In some preferred embodiments, the long axes of the N first coils are parallel with each other.

In some preferred embodiments, the first coil and the second coil are selected from Helmholtz coils.

In some preferred embodiments, the first coil is configured to receive the first-frequency current, where a half of the N first coils receive the current $I_1$, $$I_1 = I \times \cos(2 \times pi \times f \times t); \text{ and}$$

the other half of the N first coils receive the current $I_2$, $$I_2 = -Ix \times \cos(2 \times pi \times fx \times t).$$

Ix denotes an amplitude of the current in the first coil, f denotes the first frequency, t denotes time, and pi denotes π.

In some preferred embodiments, the second coil is configured to receive the first-frequency current, where a half of the 2×(N−1) second coils receive the current $I_3$, $$I_3 = Iy \times \sin(2 \times pi \times fx \times t); \text{ and}$$

the other half of the 2×(N−1) second coils receive the current $I_4$, $$I_4 = -Iy \times \sin(2 \times pi \times fx \times t).$$

Iy denotes the amplitude of the current in the first coil.

In some preferred embodiments, the excitation coil is configured to receive the second-frequency current Is, where $$I_5 = Ir \times \cos(2 \times pi \times fr \times t).$$

Ir denotes an amplitude of the current in the excitation coil, and fr denotes the second frequency.

In some preferred embodiments, a use method of the MPI device includes the following steps:

placing a scanning sample into the center of the imaging field of view, allowing the first coil, the second coil, the excitation coil and the receiving coil to receive the current to generate a plurality of FFLs, configuring the FFLs to be uniformly spread over a plane of the scanning sample, and achieving a movement of the FFLs in a space, signal excitation and signal reception;

receiving a plurality of signals based on a plurality of receiving coils, obtaining a distribution map of a concentration of magnetic nanoparticles in the scanning sample through an imaging algorithm of MPI based on the received signals, and generating an image as an MPI image; and connecting a plurality of MPI images corresponding to the plurality of signals in a predetermined spatial order to obtain an MPI image with a large field of view.

The advantages of the present invention are as follows:

(1) The device of the present invention is based on a plurality of FFLs generated by Helmholtz coils, and the rotation of FFLs can be realized by the double-layer coils receiving alternating current (AC). Additionally, an excitation field can make each of the FFLs scan a small range, and the structure of multi-FFLs can image the large-range field of view. Moreover, three-dimensional imaging can be achieved by introducing the AC of different amplitudes on a pair of Helmholtz coils, or additionally adding a static bias field to realize the migration of the FFLs in a predetermined direction.

(2) The device can carry out multi-range FFL imaging in a short time, and it is also an open-type FFL device, which is significant for the development of the large aperture MPI device for human body and the use of special scenes.

BRIEF DESCRIPTION OF THE DRAWINGS

By referring to the following figures and a detailed description of non-restrictive embodiments, the other features, purposes and advantages of the present application will become more obvious.

DETAILED DESCRIPTION OF THE EMBODIMENTS

Figure 1:
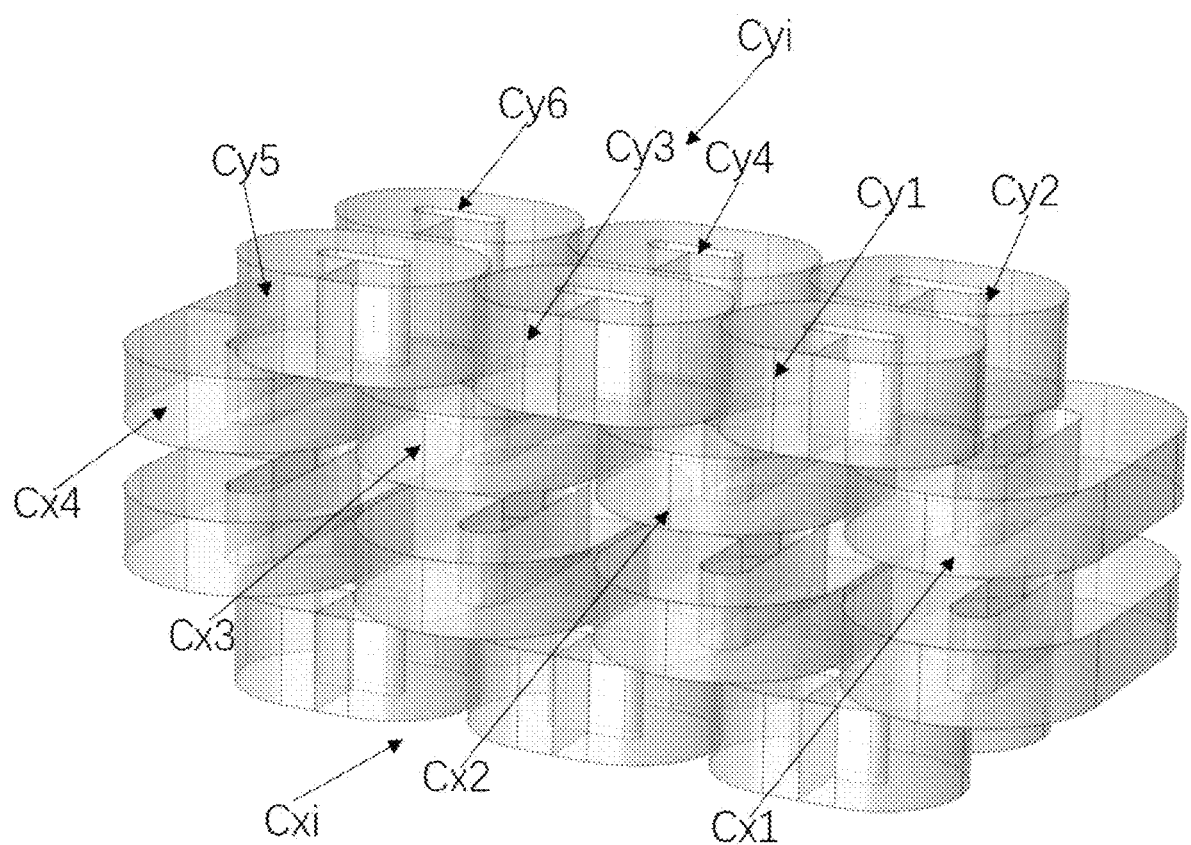
FIG. 1 is a schematic diagram showing a first coil and a second coil in an MPI device based on parallel scanning of multiple FFLs according to the present invention.

The present application is further explained in detail below in combination with the drawings and embodiments. It is understandable that the specific embodiments described herein are only used to explain the relevant invention and not to limit the present invention. It is also important to note that for the sake of description, only the parts related to the present invention are shown in the drawings.

It should be noted that the embodiments in the present application and the features in the embodiments may be combined with each other without conflict. The present application will be explained in detail below with reference to the drawings and embodiments.

Figure 2:
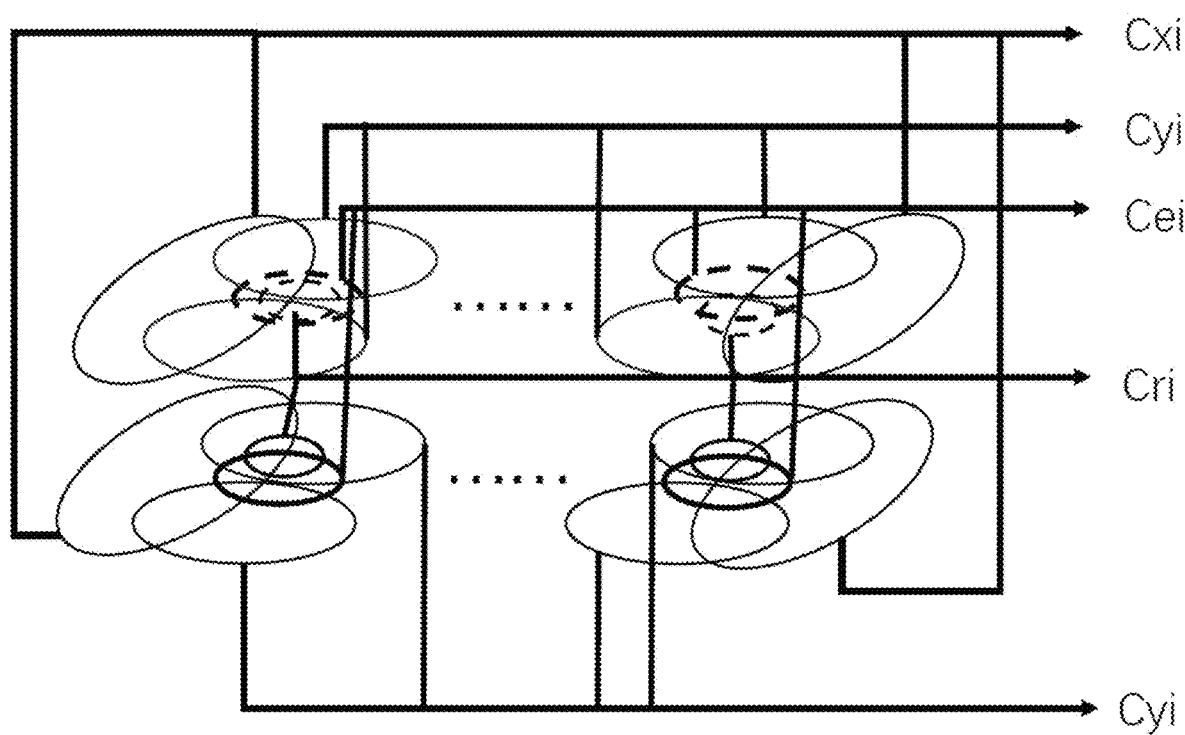
FIG. 2 is a schematic diagram showing the overall structure of the MPI device based on parallel scanning of multiple FFLs according to the present invention.
Figure 3:
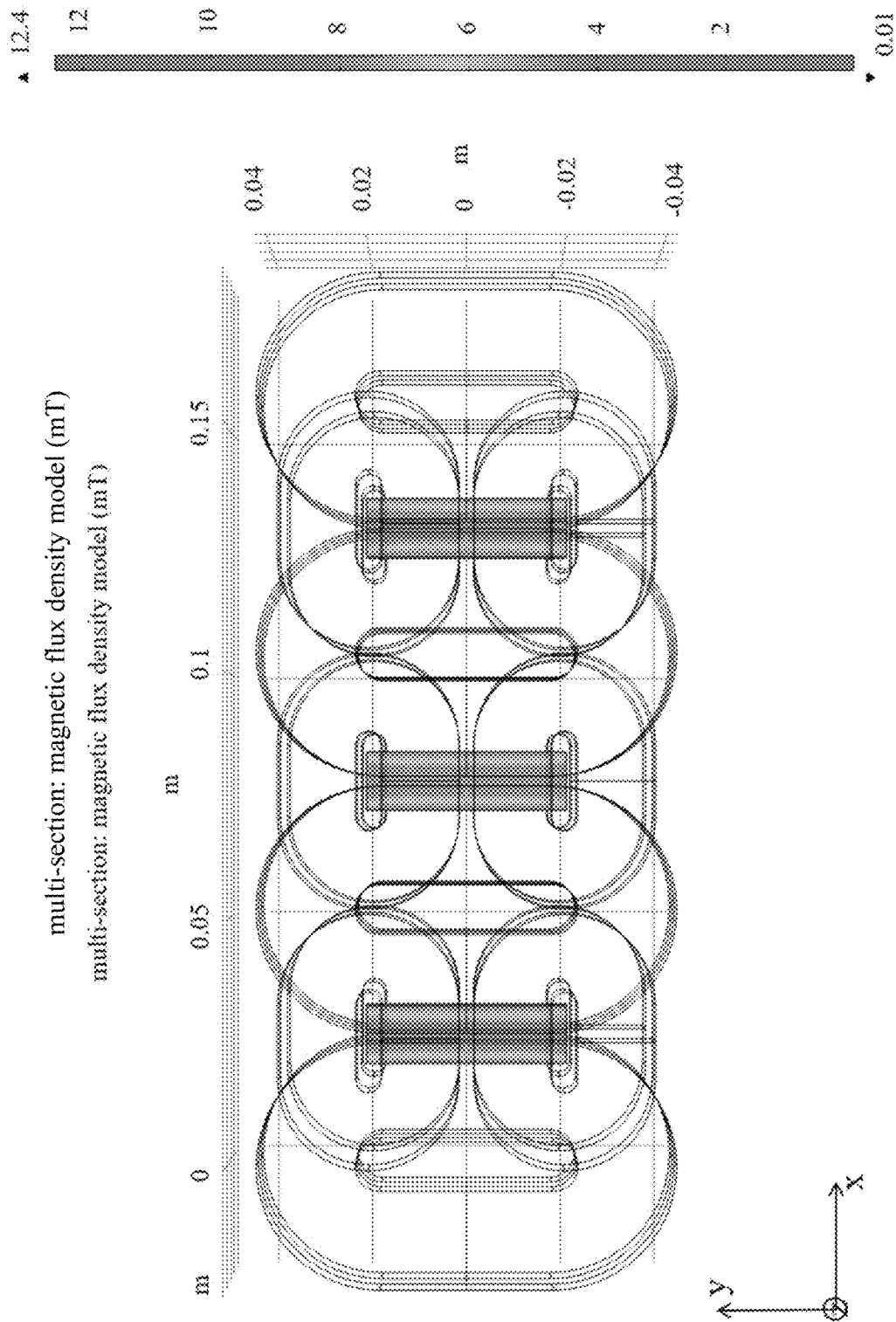
FIG. 3 is a plane effect diagram showing a plurality of FFLs generated by the MPI device based on parallel scanning of multiple FFLs according to the present invention.

Referring to FIGS. 1-3, the first embodiment of the present invention provides an MPI device based on parallel scanning of multiple FFLs. The device includes a first coil Cxi, a second coil Cyi, an excitation coil Cei, and a receiving coil Cri.

The first coil Cxi is configured to receive a first-frequency current and generate a plurality of FFLs. N first coils Cxi are uniformly provided along the plane where the N first coils Cxi are located.

The second coil Cyi is configured to receive the first-frequency current and drive the FFLs to rotate under the joint action with the first coil Cxi. 2×(N−1) second coils Cyi are uniformly provided along the plane where the 2×(N−1) second coils Cyi are located, and the second coil Cyi is provided on the side, away from the first coil Cxi, of an imaging field of view.

The excitation coil Cei is configured to receive a second-frequency current and drive the FFLs to scan fast. N−1 excitation coils Cei are uniformly provided along the plane where the N−1 excitation coils Cei are located. The excitation coil Cei is provided on the side, adjacent to the imaging field of view, of the first coil Cxi.

The receiving coil Cri receives the particle signal scanned by the FFLs at each time point, and N−1 receiving coils Cri are uniformly provided along the plane where the N−1 receiving coils Cri are located. The receiving coil Cri is provided on the side, adjacent to the imaging field of view, of the excitation coil Cei.

The first coil Cxi, the second coil Cyi, the excitation coil Cei and the receiving coil Cri are provided in longitudinal symmetry along the center of the imaging field of view.

In the present embodiment, i=1, 2, . . . , N in the first coil Cxi, and preferably, N=4. Specifically, four first coils Cxi are provided, namely Cx1, Cx2, Cx3, and Cx4.

i=1, 2, . . . , 2*(N−1) in the second coil Cyi. Therefore, six second coils Cyi are provided, namely Cy1, Cy2, Cy3, Cy4, Cy5, and Cy6.

The central position of the receiving coil Cri coincides with the central position of the excitation coil Cei, and the receiving coil Cri is configured to receive the particle signal scanned by the FFLs at each time point. A computer decodes the signal received by the receiving coil Cri to form an MPI image. i=1, 2, . . . , N−1 in the receiving coil Cri and the excitation coil Cei.

In the coils shown in FIG. 1, four pairs of first coils Cxi are provided on the same plane, and six pairs of second coils Cyi are provided to be more away from an imaging plane than the first coils Cxi. Three pairs of excitation coils Cei and three pairs of receiving coils Cri are provided and not shown in FIG. 1. The receiving coil Cri, the excitation coil Cei, the first coil Cxi, and the second coil Cyi are sequentially provided in the order of from near to far from the the imaging plane.

As a further explanation of the present invention, the long axis of the first coil Cxi is perpendicular to the long axis of the second coil Cyi.

As a further explanation of the present invention, $2 \times (N-1)$ second coils Cyi are uniformly provided along the plane where the $2 \times (N-1)$ second coils Cyi are located, which are specifically as follows:

Two columns of second coils Cyi are provided on the plane, away from the first coil Cxi, of the imaging field of view, and $N-1$ groups are provided in each column.

In the present embodiment, two columns of second coils Cyi are provided, and three groups are provided in each column. Specifically, Cy1, Cy3, and Cy5 are provided in the first column. Cy2, Cy4, and Cy6 are provided in the second column.

As a further explanation of the present invention, the straight lines where the long axes of the $N-1$ second coils Cyi in one column are located coincide with each other, and the straight lines where the long axes of the $N-1$ second coils in different columns are located are parallel with each other.

As a further explanation of the present invention, the second frequency is greater than the first frequency.

As a further explanation of the present invention, the long axes of the N first coils Cxi are parallel with each other.

As a further explanation of the present invention, the first coil Cxi and the second coil Cyi are selected from Helmholtz coils.

As a further explanation of the present invention, the first coil Cxi is configured to receive the first-frequency current, specifically:

a half of the N first coils Cxi receive the current $I_1$, $$I_1 = Ix \times \cos(2 \times pi \times f \times t).$$

The half of the N first coils Cxi in the present embodiment specifically includes Cx1 and Cx3.

The other half of the N first coils Cxi receive the current $I_2$, $$I_2 = -Ix \times \cos(2 \times pi \times f \times t).$$

Ix denotes the amplitude of the current in the first coil Cxi, f denotes the first frequency, t denotes time, and pi denotes $\pi$.

The other half of the N first coils Cxi in the present embodiment specifically includes Cx2 and Cx4.

The six second coils Cyi and the four first coils Cxi work together to form three rotatable FFLs, as shown in FIG. 3. Ix and Iy are the amplitudes of the current in coils, respectively, which are determined according to the gradient of the FFLs required. f can be taken as 10 Hz, respectively.

As a further explanation of the present invention, the second coil Cyi is configured to receive the first-frequency current, specifically:

a half of the $2 \times (N-1)$ second coils Cyi receive the current $I_3$, $$I_3 = Iy \times \sin(2 \times pi \times f \times t).$$

The half of the $2 \times (N-1)$ second coils Cyi in the present embodiment specifically includes Cy1, Cy4, and Cy5.

The other half of the $2 \times (N-1)$ second coils Cyi receive the current $I_4$, $$I_4 = -Iy \times \sin(2 \times pi \times f \times t).$$

Iy denotes the amplitude of the current in the first coil Cxi.

The other half of the $2 \times (N-1)$ second coils Cyi in the present embodiment specifically includes Cy2, Cy3, and Cy6.

As a further explanation of the present invention, the excitation coil Cei is configured to receive the second-frequency current Is, specifically:

$$I_5 = Ir \times \cos(2 \times pi \times fr \times t).$$

Ir denotes the amplitude of the current in the excitation coil Cei, fr denotes the second frequency, and fr can be taken as 20 KHz.

In the present embodiment, in the first coil Cxi and the second coil Cyi, the amplitude change of the alternating current (AC) of coils in the upper and lower planes can make the FFLs move in a z direction, or a static field is added in the z direction to realize three-dimensional imaging.

The second embodiment of the present invention provides an MPI method based on parallel scanning of multiple FFLs, which is based on the MPI device based on parallel scanning of multiple FFLs in the first embodiment. The method includes the following steps:

Step S1, a scanning sample is placed into the center of the imaging field of view, all the first coil Cxi, the second coil Cyi, the excitation coil Cei and the receiving coil Cri receive the current to generate a plurality of FFLs, the FFLs are configured to be uniformly spread over the plane of the scanning sample, and the movement of the FFLs in the space, signal excitation and signal reception are achieved.

Step S2, a plurality of signals are received based on a plurality of receiving coils Cri, the distribution map of the concentration of magnetic nanoparticles in the scanning sample is obtained through the imaging algorithm of MPI based on the received signals, and an image is generated as an MPI image.

Step S3, a plurality of MPI images corresponding to the plurality of signals are connected in a predetermined spatial order to obtain an MPI image with a large field of view.

Although the above embodiments describe all steps in the above order, those skilled in the art can understand that, in order to achieve the effect of the present embodiment, different steps are not necessarily performed in such an order, and the steps can be executed simultaneously (in parallel) or in reverse order, and these simple changes are within the scope of protection of the present invention.

The terms "first", "second", etc., are used to distinguish similar objects, not to describe or denote a particular order or priority.

The term "include/including" or any other similar term is intended to indicate non-exclusive inclusion, so that a process, method, article or equipment/device that includes a series of elements includes not only those elements, but also other elements that are not explicitly listed, or elements inherent in the process, method, article or equipment/device.

Based on the above, the technical solutions of the present invention have been described in conjunction with the preferable embodiments shown in the drawings, but it is easy for those skilled in the art to understand that the scope of protection of the present invention is obviously not limited to these specific embodiments. On the premise that it does not deviate from the principle of the present invention, those skilled in the art can make equivalent changes or replacements to the relevant technical features, and the technical solutions obtained after these changes or replacements will fall within the scope of protection of the present invention.

The invention claimed is:

1. A magnetic particle imaging (MPI) device based on parallel scanning of multiple magnetic field free lines (FFLs), comprising a first coil, a second coil, an excitation coil, and a receiving coil, wherein
the first coil is configured to receive a first-frequency current and generate a plurality of FFLs; N first coils are uniformly provided along a plane where the N first coils are located;
the second coil is configured to receive the first-frequency current and drive the plurality of FFLs to rotate under a joint action with the first coil; 2×(N−1) second coils are uniformly provided along a plane where the 2×(N−1) second coils are located, and the second coil is provided on a side, away from the first coil, of an imaging field of view;
the excitation coil is configured to receive a second-frequency current and drive the plurality of FFLs to scan fast; N−1 excitation coils are uniformly provided along a plane where the N−1 excitation coils are located; the excitation coil is provided on a side, adjacent to the imaging field of view, of the first coil;
the receiving coil receives a particle signal scanned by the plurality of FFLs at each time point, and N−1 receiving coils are uniformly provided along a plane where the N−1 receiving coils are located; the receiving coil is provided on a side, adjacent to the imaging field of view, of the excitation coil; and
the first coil, the second coil, the excitation coil and the receiving coil are provided in longitudinal symmetry along a center of the imaging field of view;
wherein the 2×(N−1) second coils are uniformly provided along the plane where the 2×(N−1) second coils are located, comprising:
two columns of second coils are provided on a plane, away from the first coil, of the imaging field of view, and N−1 groups are provided in each column;
wherein straight lines where long axes of the N−1 second coils in one column are located coincide with each other, and the straight lines where the long axes of the N−1 second coils in different columns are located are parallel with each other;
a second frequency is greater than a first frequency; and N≥4.

2. The MPI device based on parallel scanning of multiple FFLs according to claim 1, wherein a long axis of the first coil is perpendicular to the long axis of the second coil.

3. The MPI device based on parallel scanning of multiple FFLs according to claim 2, wherein the long axes of the N first coils are parallel with each other.

4. The MPI device based on parallel scanning of multiple FFLs according to claim 3, wherein the first coil and the second coil are selected from Helmholtz coils.

5. The MPI device based on parallel scanning of multiple FFLs according to claim 4, wherein the first coil is configured to receive the first-frequency current, wherein
a first half of the N first coils receive a current $I_1$, $$I_1 = Ix \times \cos(2 \times pi \times f \times t); \text{ and}$$

a second half of the N first coils receive a current $I_2$, $$I_2 = -Ix \times \cos(2 \times pi \times f \times t);$$

wherein Ix denotes an amplitude of the current in the first coil, f denotes the first frequency, t denotes time, and pi denotes π.

6. The MPI device based on parallel scanning of multiple FFLs according to claim 5, wherein the second coil is configured to receive the first-frequency current, wherein
a first half of the 2×(N−1) second coils receive a current $I_3$, $$I_3 = Iy \times \sin(2 \times pi \times f \times t); \text{ and}$$

a second half of the 2×(N−1) second coils receive a current $I_4$, $$I_4 = -Iy \times \sin(2 \times pi \times f \times t);$$

wherein Iy denotes the amplitude of the current in the first coil.

7. The MPI device based on parallel scanning of multiple FFLs according to claim 6, wherein the excitation coil is configured to receive the second-frequency current $I_5$, wherein $$I_5 = Ir \times \cos(2 \times pi \times fr \times t);$$

wherein Ir denotes an amplitude of the current in the excitation coil, and fr denotes the second frequency.

8. The MPI device based on parallel scanning of multiple FFLs according to claim 7, wherein a use method of the MPI device comprises the following steps:
placing a scanning sample into the center of the imaging field of view, allowing the first coil, the second coil, the excitation coil and the receiving coil to receive a current to generate a plurality of FFLs, configuring the plurality of FFLs to be uniformly spread over a plane of the scanning sample, and achieving a movement of the plurality of FFLs in a space, signal excitation and signal reception;
receiving a plurality of signals based on a plurality of receiving coils, obtaining a distribution map of a concentration of magnetic nanoparticles in the scanning sample through an imaging algorithm of MPI based on the received signals, and generating an image as an MPI image; and
connecting a plurality of MPI images corresponding to the plurality of signals in a predetermined spatial order to obtain an MPI image with a large field of view.

* * * * *